United States Patent
Bandyopadhyay et al.

(10) Patent No.: US 10,284,213 B2
(45) Date of Patent: May 7, 2019

(54) ANALOG-TO-DIGITAL CONVERTER REUSING COMPARATOR FOR RESIDUE AMPLIFIER FOR NOISE SHAPING

(71) Applicant: Analog Devices, Inc., Norwood, MA (US)

(72) Inventors: Abhishek Bandyopadhyay, Winchester, MA (US); Rong Jin, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/912,128

(22) Filed: Mar. 5, 2018

(65) Prior Publication Data

US 2018/0309458 A1 Oct. 25, 2018

Related U.S. Application Data

(60) Provisional application No. 62/488,500, filed on Apr. 21, 2017.

(51) Int. Cl.
*H03M 1/12* (2006.01)
*H03M 1/08* (2006.01)
(Continued)

(52) U.S. Cl.
CPC ......... *H03M 1/0854* (2013.01); *H03M 1/804* (2013.01); *H03M 3/46* (2013.01); *H03M 1/468* (2013.01)

(58) Field of Classification Search
CPC .......... H03M 1/38; H03M 1/804; H03M 1/08; H03M 1/1009; H03M 1/1245; H03M 1/466; H03M 1/667; H03M 1/12
(Continued)

(56) References Cited

U.S. PATENT DOCUMENTS

| | | | |
|---|---|---|---|
| 6,346,898 B1 * | 2/2002 | Melanson | H03M 1/0668 |
| | | | 341/143 |
| 8,102,292 B1 * | 1/2012 | Van Ess | H03M 3/426 |
| | | | 341/143 |

(Continued)

FOREIGN PATENT DOCUMENTS

| | | |
|---|---|---|
| CN | 104426549 | 3/2015 |
| CN | 105591650 | 5/2016 |
| WO | WO-2018195350 A1 | 10/2018 |

OTHER PUBLICATIONS

Chen, Zhijie, et al., "A 9.35-ENOB, 14.8 fJ/conv.-step Fully-Passive Noise-Shaping SAR ADC", 2015 Symposium on VLSI Circuits Digest of Technical Papers, (2015), C64-C65.
(Continued)

*Primary Examiner* — Linh V Nguyen
(74) *Attorney, Agent, or Firm* — Schwegman Lundberg & Woessner, P.A.

(57) ABSTRACT

Some or all of a comparator circuit of an analog-to-digital converter (ADC) circuit can be efficiently repurposed or reused for residue amplification for efficient noise-shaping, e.g., in a noise-shaping feedback configuration. A preamplifier portion of a comparator circuit in an oversampling ADC can be re-purposed to provide an amplifier to amplify or otherwise modify a residue left after the bit trials of a conversion cycle. The amplified or modified residue can then be used elsewhere, for example, for noise-shaping by applying a noise transfer function (NTF), a result of which can then be fed back (e.g., summed with the next sampled input at an input of the comparator circuit for use in the N bit trials of the next ADC cycle).

20 Claims, 11 Drawing Sheets

(51) Int. Cl.
*H03M 1/80* (2006.01)
*H03M 3/00* (2006.01)
*H03M 1/46* (2006.01)

(58) Field of Classification Search
USPC .................. 341/118–121, 155, 143, 172
See application file for complete search history.

(56) References Cited

U.S. PATENT DOCUMENTS

| | | | |
|---|---|---|---|
| 9,197,240 B1* | 11/2015 | Kinyua | H03M 1/002 |
| 9,219,494 B2* | 12/2015 | Liu | H03M 3/398 |
| 9,425,818 B1* | 8/2016 | Rajaee | H03M 3/32 |
| 9,614,540 B1* | 4/2017 | Kull | H03M 1/462 |
| 9,621,179 B1* | 4/2017 | Maulik | H03M 1/466 |
| 9,698,805 B1 | 7/2017 | Bandyopadhyay | |
| 9,722,746 B2 | 8/2017 | Ho et al. | |
| 9,800,256 B2* | 10/2017 | Lee | H03M 1/1245 |
| 2005/0200510 A1* | 9/2005 | Yoshida | H03M 1/1245 341/155 |
| 2007/0222656 A1* | 9/2007 | Melanson | H03M 3/39 341/155 |
| 2010/0164761 A1 | 7/2010 | Wan et al. | |
| 2014/0277269 A1 | 9/2014 | Lee | |
| 2016/0352351 A1* | 12/2016 | Miki | H03M 1/0626 |
| 2017/0126239 A1* | 5/2017 | Sun | H03M 1/08 |
| 2017/0317683 A1* | 11/2017 | Bandyopadhyay | H03M 1/002 |
| 2018/0083647 A1* | 3/2018 | Yoshioka | H03M 1/0656 |
| 2018/0183450 A1* | 6/2018 | Liu | H03M 1/1215 |

OTHER PUBLICATIONS

Fredenburg, Jeffrey A., et al., "A 90-MS/s 11-MHz-Bandwidth 62-dB SNDR Noise-Shaping SAR ADC", IEEE Journal of Solid-State Circuits, vol. 47, No. 12, (Dec. 2012), 2898-2904.

Shu, Yun-Shiang, et al., "An Oversampling SAR ADC with DAC Mismatch Error Shaping Achieving 105dB SFDR and 101dB SNDR over 1kHz BW in 55nm CMOS", ISSCC 2016, Digest of Technical Papers, (Feb. 3, 2016), 457-459.

Wakaumi, Hiroo, "A High-Speed CMOS OP Amplifier with a Dynamic Switching Bias Circuit", SICE Annual Conference 2011, (2011), 2370-2373.

"International Application Serial No. PCT US2018 028429, International Search Report dated Aug. 12, 2018", 4 pgs.

"International Application Serial No. PCT US2018 028429, Written Opinion dated Aug. 12, 2018", 5 pgs.

* cited by examiner

US 10,284,213 B2

ANALOG-TO-DIGITAL CONVERTER REUSING COMPARATOR FOR RESIDUE AMPLIFIER FOR NOISE SHAPING

CLAIM OF PRIORITY

This application claims the benefit of priority of U.S. Provisional Patent Application Ser. No. 62/488,500, titled "ANALOG-TO-DIGITAL CONVERTER REUSING COMPARATOR FOR RESIDUE AMPLIFIER FOR NOISE SHAPING" to Abhishek Bandyopadhyay et al., filed on Apr. 21, 2017, the entire contents of which being incorporated herein by reference.

FIELD OF THE DISCLOSURE

This document pertains generally, but not by way of limitation, to integrated circuits and electronics, and more particularly, but not by way of limitation to analog-to-digital converters and signal-processing circuits.

BACKGROUND

Various circuit topologies can be used for analog-to-digital conversion (ADC) of a signal, such as flash ADC, pipelined ADC, sigma-delta ADC, successive approximation register (SAR) ADC. Applications for such circuits can impose demanding constraints on accuracy, efficiency, size, speed, and other considerations.

SUMMARY OF THE DISCLOSURE

The present inventors have recognized, among other things, that some or all of a comparator circuit of a SAR ADC can be efficiently repurposed or reused for residue amplification for efficient noise-shaping, e.g., in a noise-shaping feedback configuration, with some modifications to allow such repurposing. A detailed example is explained below, in which a preamplifier portion of a comparator circuit in an oversampling SAR ADC can be re-purposed or re-used to provide an amplifier to amplify or otherwise modify a residue left after the N bit trials of an N-bit SAR conversion cycle. The amplified or modified residue can then be used elsewhere, for example, for noise-shaping by applying a noise transfer function (NTF), a result of which can then be fed back (e.g., summed with the next sampled input at an input of the comparator circuit for use in the N bit trials of the next SAR ADC cycle).

In some aspects, this disclosure is directed to an analog-to-digital converter (ADC) circuit comprising a digital-to-analog converter (DAC) circuit to receive a sampled input signal; a comparator circuit having first and second inputs, the first input coupled to an output of the DAC circuit and configured to compare the output of the DAC circuit at the first input to a voltage at the second input; a noise-shaping feedback circuit coupled to an input of the comparator circuit; and a control circuit coupled to the output of the comparator circuit and an input of the DAC circuit, wherein, after a conversion phase and before an acquisition phase, the control circuit reconfigures the comparator circuit to operate as an amplifier circuit to process a quantization error at the DAC circuit after all bit trials of the sampled input signal and apply the processed quantization error to the noise-shaping feedback circuit coupled to an input of the ADC circuit.

In some aspects, this disclosure is directed to a method of operating an analog-to-digital converter (ADC) circuit, the method comprising: during a conversion phase: receiving a sampled input signal on a digital-to-analog converter (DAC) circuit; comparing, using a comparator circuit having first and second inputs, an output of the DAC circuit at the first input to a voltage at the second input; and after the conversion phase and before an acquisition phase: reconfiguring the comparator circuit to operate as an amplifier circuit to process a quantization error at the DAC circuit after all bit trials of the sampled input signal and applying the processed quantization error to the noise-shaping feedback circuit coupled to an input of the ADC circuit.

In some aspects, this disclosure is directed to an analog-to-digital converter (ADC) circuit comprising: during a conversion phase: means for receiving a sampled input signal on a digital-to-analog converter (DAC) circuit; means for comparing an output of the DAC circuit at the first input to a voltage at the second input; and after the conversion phase and before an acquisition phase: the means for comparing reconfigured to operate as a means for amplifying to process a quantization error at the DAC circuit after all bit trials of the sampled input signal and means for applying the processed quantization error to the noise-shaping feedback circuit coupled to an input of the ADC circuit.

This overview is intended to provide an overview of subject matter of the present patent application. It is not intended to provide an exclusive or exhaustive explanation of the invention. The detailed description is included to provide further information about the present patent application.

Figure 1:
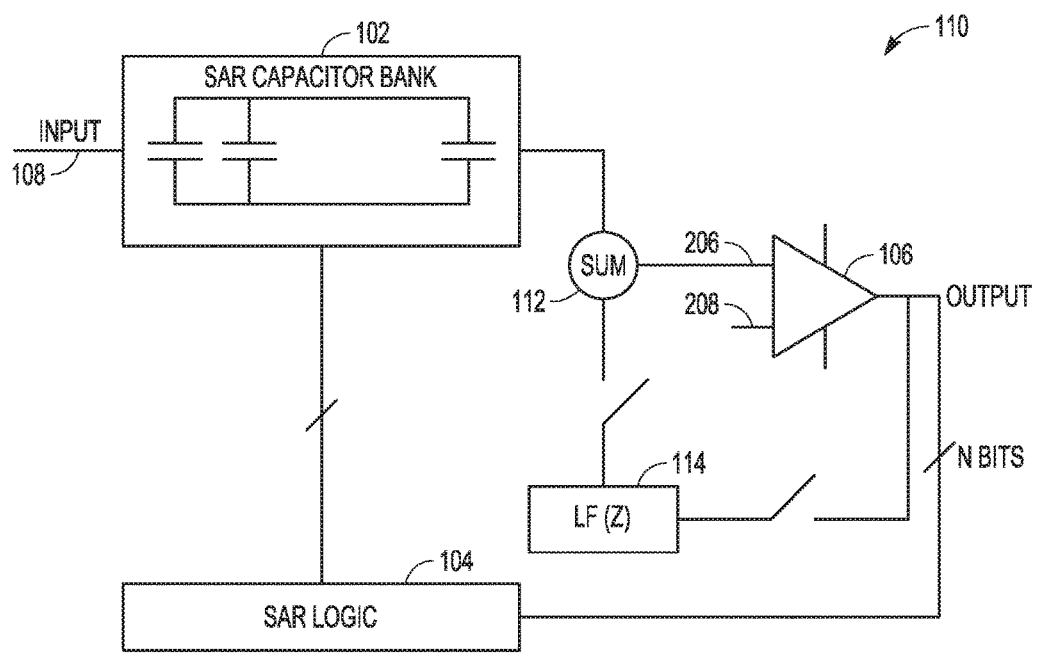
FIG. 1 shows an example of portions of an N-bit SAR ADC circuit, where N is an integer greater than 1, such as for performing an 8-bit, 12-bit, 16-bit, or even higher bit ADC.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized a need for efficient ways to improve noise performance in SAR and other ADCs and other signal processing integrated circuits. A SAR ADC topology can exhibit a high conversion efficiency relative to other topologies, albeit with certain constraints on resolution and bandwidth. In general, SAR ADCs do not require using any linear blocks, and can be manufactured in a manner that is compatible with digital integrated circuit manufacturing techniques, and can use low supply voltage.

The present inventors have recognized, among other things, that for moderate to high resolution SAR ADCs, a comparator circuit (e.g., used to compare a digital-to-analog converter (DAC) voltage to a reference) can be the dominant source of noise and of power consumption. The comparator circuit can include an amplifier portion (which can also be referred to as a preamplifier) and a latch portion. For a high-resolution SAR ADC, the preamplifier can dominate the power budget of the SAR ADC circuit.

Noise-shaping can be used to improve the noise portion of the SAR ADC, but such noise-shaping can involve using active circuits that consume additional power. For example, one approach to a noise-shaped SAR ADC may need an extra operational transconductance amplifier (OTA) circuit to realize a desired noise transfer function (NTF), e.g., for first-order noise shaping, which may impose additional constraints on one or more of: oversampling ratio (OSR), bandwidth, supply voltage headroom, power consumption, or other parameters. While a passive approach to noise-shaping can be used, its effectiveness may be limited by charge-sharing effects, and the integrated circuit (IC) area needed to implement the desired noise-shaping. In sum, for an active approach to noise-shaping, extra operational amplifiers are generally needed, which can impact power consumption, IC area, or both. Passive noise shaping techniques are generally not as effective as active ones, since passive noise-shaping techniques involve charge sharing, which affects the noise-shaping efficiency.

The present inventors have recognized, among other things, that some or all of a preamplifier portion of the SAR ADC can be efficiently repurposed or reused for residue amplification for efficient noise-shaping, e.g., in a noise-shaping feedback configuration, with some modifications to allow such repurposing. A detailed example is explained below, in which a preamplifier portion of a comparator circuit in an oversampling SAR ADC can be reconfigured (or re-purposed or re-used) to provide an amplifier to amplify or otherwise modify a residue left after the N bit trials of an N-bit SAR conversion cycle. The amplified or modified residue can then be used elsewhere, for example, for noise-shaping by applying a noise transfer function (NTF), a result of which can then be fed back (e.g., summed with the next sampled input at an input of the comparator circuit for use in the N bit trials of the next SAR ADC cycle).

FIG. 1 shows an example of portions of an N-bit SAR ADC circuit 110, where N is an integer greater than 1, such as for performing an 8-bit, 12-bit, 16-bit, or even higher bit ADC. The SAR ADC circuit 110 can include a digital-to-analog converter DAC circuit 102, operation of which can be controlled by control circuit 104, including SAR logic circuitry. The DAC circuit 102 can operate in a current mode, e.g., a current DAC using current sources, in a voltage mode, e.g., a resistive DAC, or in a charge mode, e.g., using capacitors. The DAC circuit 102 in FIG. 1 is depicted as a capacitor bank. In some examples, the DAC circuit 102 can include a switched capacitor DAC circuit.

A comparator circuit 106, which can include an amplifier portion (which can also be referred to as a preamplifier) and a latch portion, can be used to compare an analog input signal sampled onto the SAR capacitor bank 102 at input 108 to a specified threshold voltage, such as using a binary search or other SAR, to provide an N-bit digital word representative of that sample of the analog input signal. Assuming that N cycles have been performed, one more cycle is performed in which the SAR logic 104 loads the Nth decision onto the DAC circuit 102 and determines the quantization noise or error at that point in the conversion process. In this phase, the DAC circuit 102 is holding the error, or residue, from the current decision. Next, the SAR logic 104 can apply the quantization noise to a loop filter 114 in a feedback path, which can be applied to the DAC circuit 102 for the next conversion cycle. The feedback path can include a noise-transfer function (NTF) which can be represented as NTF=1-LF(z), where LF(z) can represent the z-domain transfer function of a loop filter 114 in the feedback path.

In accordance with this disclosure, in FIG. 1, the comparator circuit can be used normally during a conversion phase, but after a conversion phase and before an acquisition phase, the control circuit 104 can reconfigure the comparator circuit as an amplifier circuit to process, e.g., filter, amplify, or buffer, a quantization error at the DAC circuit after all the bit trials of a sample and apply the processed quantization error to the noise-shaping feedback circuit coupled to an input of the ADC circuit. In other words, after a conversion phase and before an acquisition phase, the comparator circuit 106 can be reconfigured, re-purposed or re-used, such as for one or more of sampling, filtering, buffering, or amplifying a residue remaining after the N-bit SAR conversion of a particular SAR cycle, which can be provided for use elsewhere, such as for use in a feedback configuration to a summing node 112 of the comparator circuit 106, such as for use in noise-shaping during the next SAR cycle.

The techniques of this disclosure are in contrast to other techniques in which a separate amplifier is used for applying the quantization error to the feedback circuit. Here, by reconfiguring a portion of the comparator circuit 106 as an amplifier circuit, both die area and power consumption can be reduced.

Figure 2:
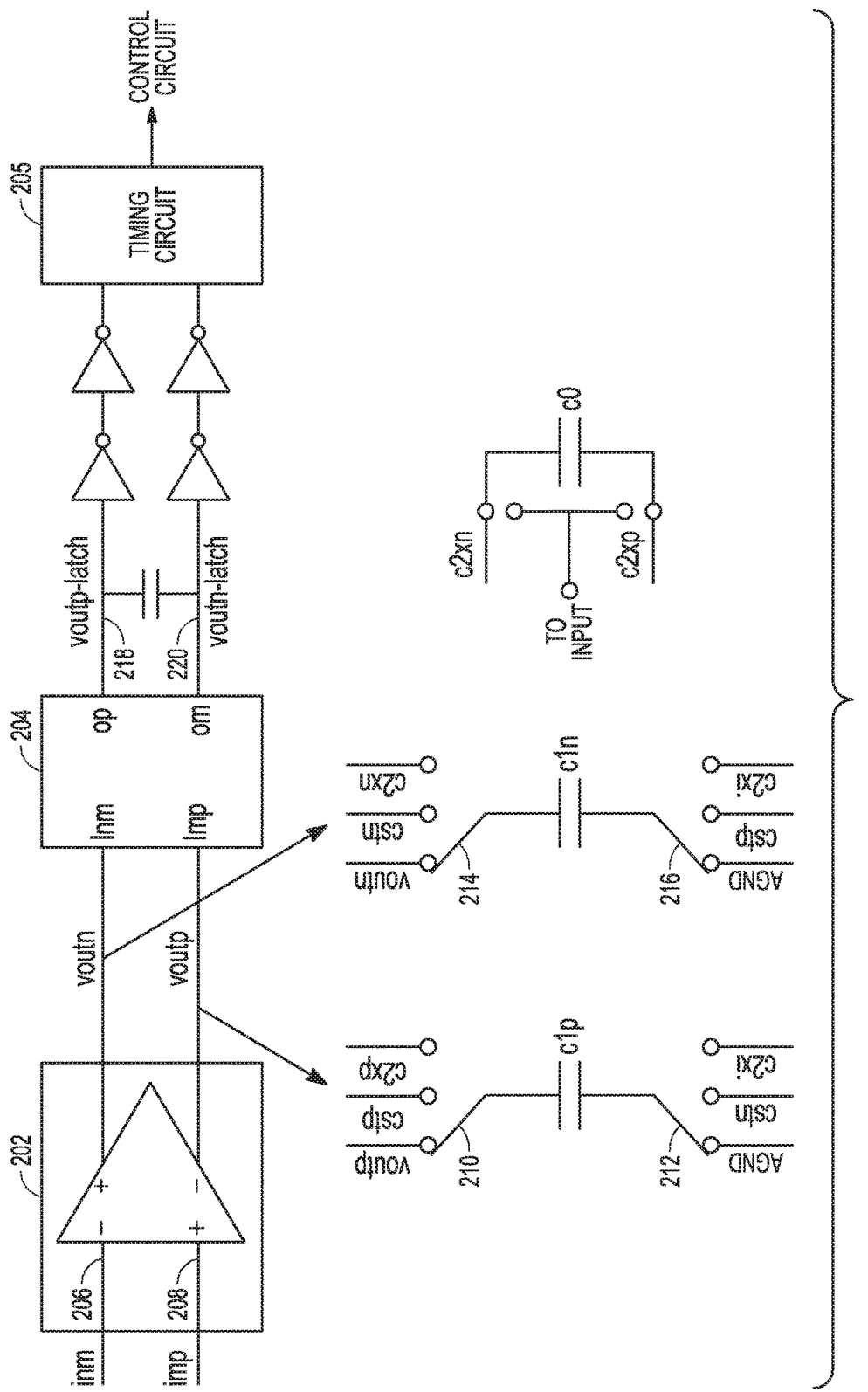
FIG. 2 shows an example of a comparator circuit that can be reconfigured as an amplifier circuit in accordance with various techniques of this disclosure.

FIG. 2 shows an example of a first-stage preamplifier portion 202 of the comparator circuit 106 (top left), a second-stage latch portion 204 of the comparator circuit (top right), and (bottom) various states for sampling the preamplifier portion 202 of the comparator circuit 106 and transferring a representative signal, such as for charge storage for applying to the summing node of the comparator circuit 106 for use in the next SAR ADC. Timing circuitry 205 can include, for example, logic gates and flip-flops.

In the single-ended configuration depicted in FIG. 2, the inputs 206, 208 of the preamplifier portion 202 can be switchably coupled to an output of a DAC circuit, e.g., DAC circuit 102 of FIG. 1, and a reference voltage, respectively. In a differential configuration, input 208 can be switchably coupled to an output of another DAC circuit to receive a complementary signal, e.g., in a P-DAC and an N-DAC configuration.

The first-stage preamplifier portion 202 of the comparator circuit 106, together with residue voltage sampling capacitors $C1p$ and $C1n$, can be switched in during residue voltage sampling, and switched out during SAR comparator latching. A common mode signal bias circuit can be used to generate a common mode bias signal for use by the preamplifier, and a differential residue voltage signal can be sampled and used elsewhere, such as for the noise shaping.

During normal operation, a comparator circuit operates in an open loop configuration while an amplifier circuit operates in a closed loop configuration. Using various techniques of this disclosure, the comparator circuit can be temporarily reconfigured to operate as an amplifier by operating in a closed loop configuration. This involves turning a circuit that usually works in open loop (a comparator) to work in a stable feedback system (an amplifier). More particularly, the comparator circuit 106 of FIG. 1 can be used normally during a conversion phase, but after a conversion phase and before an acquisition phase, the control circuit 104 can reconfigure the preamplifier portion 202, as an amplifier circuit to process, e.g., filter, amplify, or buffer, a quantization error at the DAC circuit following all the bit trials of a conversion phase.

After the preamplifier portion 202 has been reconfigured as an amplifier, the representation of the quantization noise, e.g., the residue or residual voltage, at the input of the preamplifier portion 202 can be amplified and a differential voltage can be stored on capacitors $C1p$ and $C1n$, e.g., primary capacitors. That is, after all the bit trials of a conversion phase are completed, the capacitors $C1p$ and $C1n$ can be coupled to the outputs Voutp and Voutn of the preamplifier portion 202 using switches 210-216 and to corresponding inputs of the latch portion 204. The two output voltages present at the outputs Voutp and Voutn of the preamplifier portion 202 can be stored on the capacitors $C1p$ and $C1n$, respectively.

Next, the control circuit 104 (of FIG. 1) can control the switches 210-216 to disconnect the capacitors $C1p$ and $C1n$ from the amplifier portion 202 in response to a state of the outputs 218, 220 of the latch stage 204, e.g., a change in state. That is, when the control circuit 104 determines that latch portion 204 output signals "Voutp_latch" and "Voutn_latch" have flipped states.

Then, the control circuit 104 (of FIG. 1) can control the switches 210-216 to couple the capacitors $C1p$ and $C1n$ in opposition to create a voltage difference between the capacitors $C1p$ and $C1n$. Due to charge sharing, the resulting differential voltage can be the half of the amplified voltage.

The control circuit 104 (of FIG. 1) can then control the switches 210-216 to couple the capacitors $C1p$ and $C1n$ in series to double the voltage, which is equivalent to the amplified residual voltage. The control circuit 104 can then control the switches 210-216 to couple the primary capacitors $C1p$ and $C1n$ to a secondary capacitor C0 to transfer the residual charge. The capacitor C0, e.g., a "reservoir capacitor", can contain the filtered quantization noise to be added to ADC for the next conversion cycle.

The secondary capacitor C0 can be larger than the primary capacitors $C1p$ and $C1n$ in order to store the residual charge from the previous conversion cycle. In some examples, the secondary capacitor C0 can act as an integrator for the transferred residual charge.

At the beginning of the next conversion cycle, the control circuit 104 (of FIG. 1) can control switches 210-216 to couple the capacitor C0 to the input 108 of the ADC circuit 110 (of FIG. 1) to add the residue charge for noise-shaping. This can be accomplished by either adding the filtered residue to voltage terminal 206 (FIG. 1) or by subtracting the filtered residue from the reference, terminal 208 (FIG. 1). After the control circuit 104 (of FIG. 1) has transferred the charge from the capacitor C0 to the input 108 of the ADC circuit 110, the control circuit 104 (of FIG. 1) can reconfigure the preamplifier portion 202 back to its open loop configuration to operate as a comparator.

In some example implementations, the control circuit 104 (of FIG. 1) can reconfigure the comparator circuit 106 (of FIG. 1) as a static amplifier circuit to process, e.g., filter, amplify, or buffer, the quantization error at the DAC circuit following a bit trial and apply the processed quantization error to the noise-shaping feedback circuit coupled to an input of the ADC circuit. In some such configurations, the static amplifier circuit can include a differential pair transistor configuration connected to a current source to provide a static bias current.

However, the present inventors have recognized that in some example configurations, it can be desirable to reconfigure the comparator circuit 106 (of FIG. 1) as a dynamic amplifier to process, e.g., filter, amplify, or buffer, the quantization error at the DAC circuit following a bit trial. In some dynamic amplifier configurations, a differential pair transistor configuration can be connected to a clocked switch, rather than a current source, to provide the bias current. When the switch is clocked ON, the bias current is provided and when the switch is clocked OFF, the bias current is OFF and the circuit is in a disabled mode and does not draw current. An example dynamic amplifier circuit is described in a paper titled "A High-Speed CMOS OP Amplifier with a Dynamic Switching Bias Current," to Hiroo Wakaumi, the entire content of which being incorporated herein by reference.

Although the configuration was described above using passive filter components, namely capacitors $C1p$ and $C1n$, in some example implementations, the techniques of this disclosure can be implemented using active filter components, e.g., operational amplifier based filter circuits, instead of or in addition to passive filter components.

In addition, although the circuit was described as a first order system, in some example configurations, the system can be more complex and/or a higher order system. For example, additional switches and capacitors can be included to implement a higher order system, e.g., second order, third order, or higher. Further, in some example implementations, the filter coefficients can be programmable. For example, the control circuit 104 (of FIG. 1) can control the additional switches to couple to various sizes of capacitors in the circuit.

As described above, the residue voltage can be amplified before being applied to the filter circuit including capacitors $C1p$ and $C1n$. However, in other configurations, the residue voltage can be amplified after filtering and then transferred to the capacitor C0.

As indicated above, a single-ended configuration is depicted in FIG. 2. In a differential configuration, two additional primary capacitors can be included as part of the filter circuit that includes capacitors $C1p$ and $C1n$.

Figure 3:
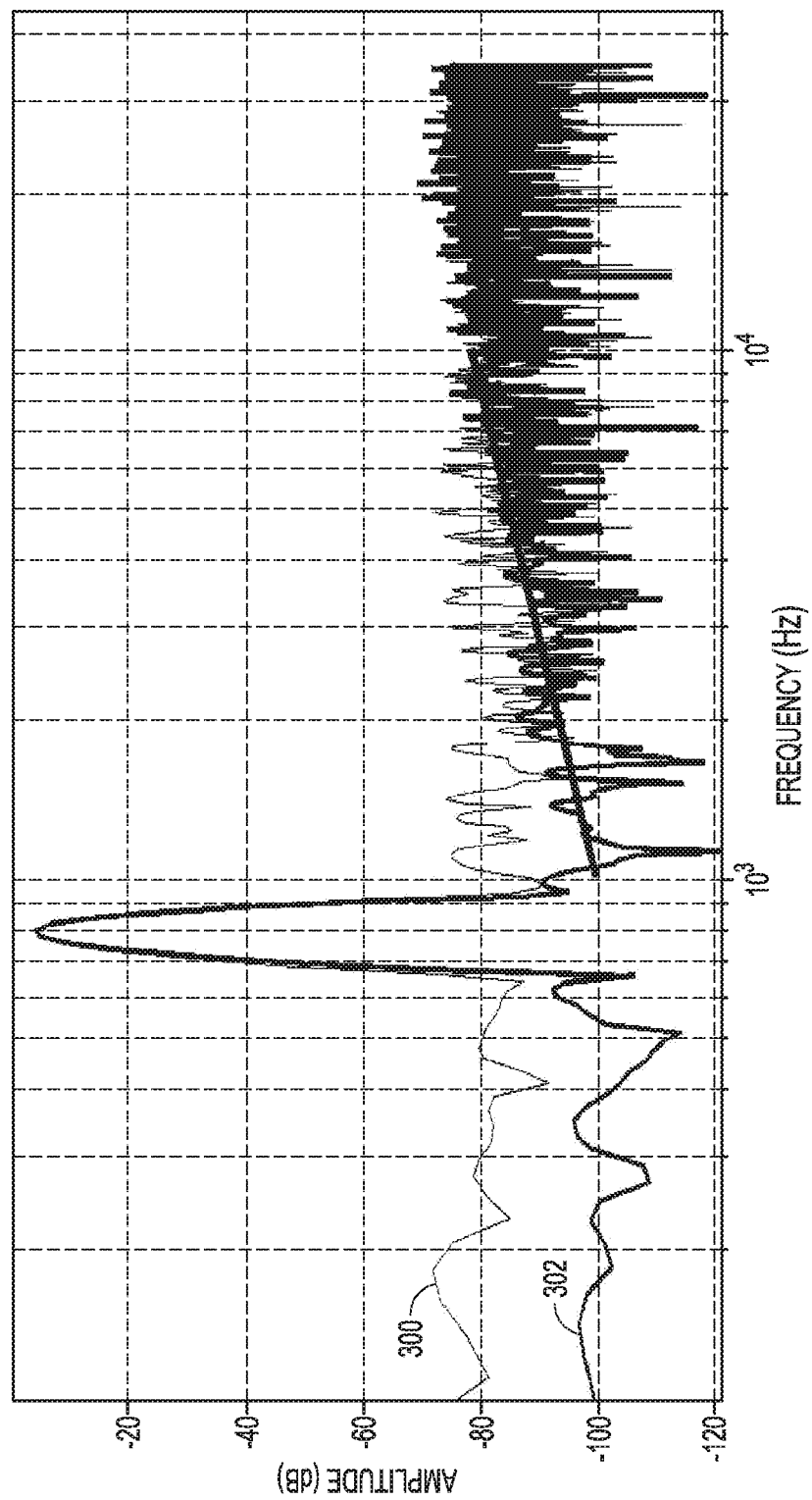
FIG. 3 shows an example of SPICE computer simulation results for a first-order SAR using the proposed technique of reconfiguring the comparator circuit as an amplifier circuit for use in noise-shaping the N-bit SAR conversion.

FIG. 3 shows an example of SPICE computer simulation results for a first-order SAR using the proposed technique of reconfiguring the comparator circuit as an amplifier circuit for use in noise-shaping the N-bit SAR conversion. The x-axis represents frequency in Hertz (Hz) and the y-axis represents amplitude in decibels (dB).

One SAR approach is identified by line 300 and the proposed technique is identified by line 302. As seen in FIG. 3, the SAR approach identified by line 300 has a signal-to-noise ratio (SNR) of 48.75 dB for a 2 MHz bandwidth. The proposed technique shown by line 302, however, has an improved SNR of 58.17 dB.

Figure 4A:
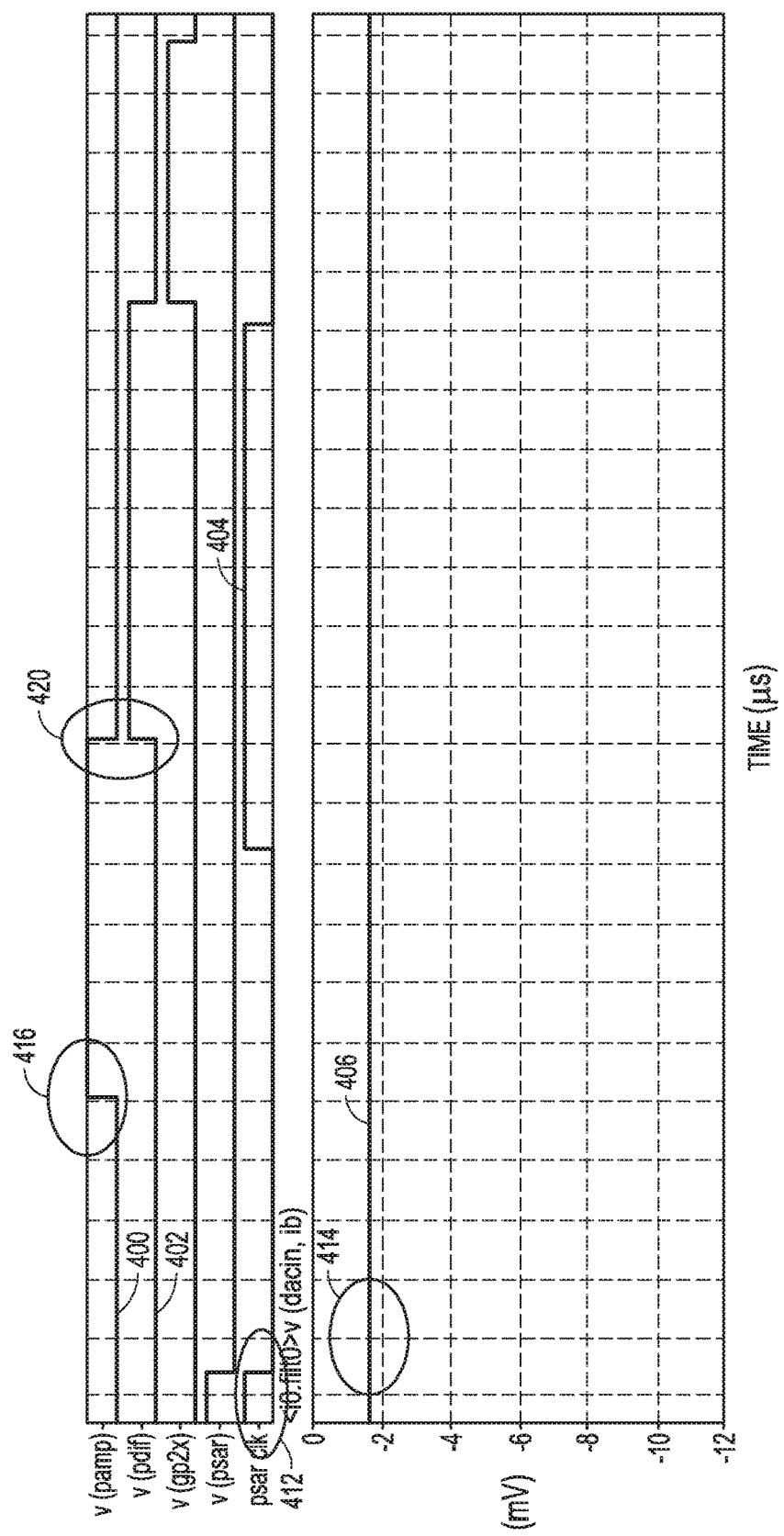
FIGS. 4A and 4B show an example of SPICE computer simulation transient analysis results, noting various occurrences on various signals of interest.
Figure 4B:
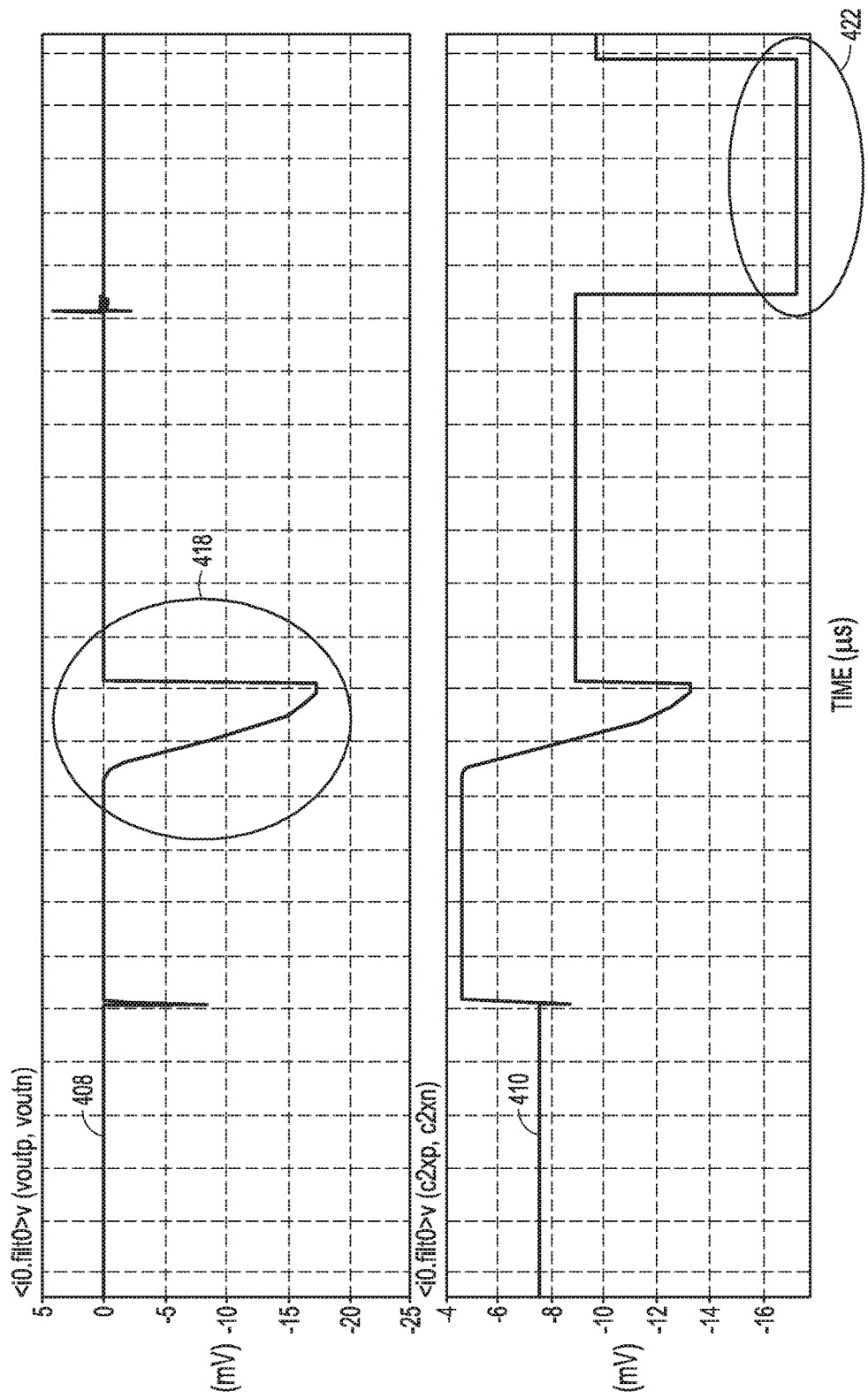

FIGS. 4A and 4B show an example of SPICE computer simulation transient analysis results, noting various occurrences on various signals of interest. Signal 400 labeled "v(pamp)" represents an output voltage of a first logic gate in the timing circuitry 205 of FIG. 2. Signal 402 labeled "v(pdif)" represents an output voltage of a second logic gate in the timing circuitry 205 of FIG. 2. Signal 404 labeled "psar_clk" represents a clock signal. Signal 406 represents a voltage on the capacitor DAC in millivolts (mV). Signal 408 represents an output voltage in mV of the first-stage preamplifier portion 202 of the comparator circuit (of FIG. 2) when reconfigured to operate as an amplifier circuit, e.g., dynamic amplifier. Signal 410 represents a voltage on capacitor C1$p$ and C1$n$.

FIGS. 4A and 4B graphically depicts the timing involved with reconfiguring the comparator circuit to operate as an amplifier circuit to process a quantization error at the DAC circuit after all the bit trials and applying the processed quantization error to a noise-shaping feedback circuit coupled to an input of the ADC circuit. The previous SAR conversion cycle is completed at 412. The residual voltage on the capacitive DAC of the SAR capacitor bank 102 is shown at 414. At 416, the SAR preamplifier portion of the comparator circuit is reconfigured to operate as an amplifier circuit, e.g., dynamic amplifier, for residue amplification of the residue voltage left at the end of the previous SAR conversion cycle. In this example the amplifier includes a dynamic amplifier stage and the latch stage.

The output voltage signal of the amplifier portion of the comparator circuit is shown at 418. Then, the amplifier circuit is disabled at 420 when the latch stage of the comparator flips, indicating that the required gain has been achieved. In the example show, the dynamic amplifier shows a gain of about 10×, amplifying a 1.8 mV residue voltage into an 18 mV signal for storage for feedback for noise-shaping during the next SAR cycle. At 422, the dynamic amplifier is locked on a capacitor C1, which is the series connection of C1$p$ and C1$n$, thereby transferring the amplified residual charge onto C1$p$ and C1$n$.

Figure 5:
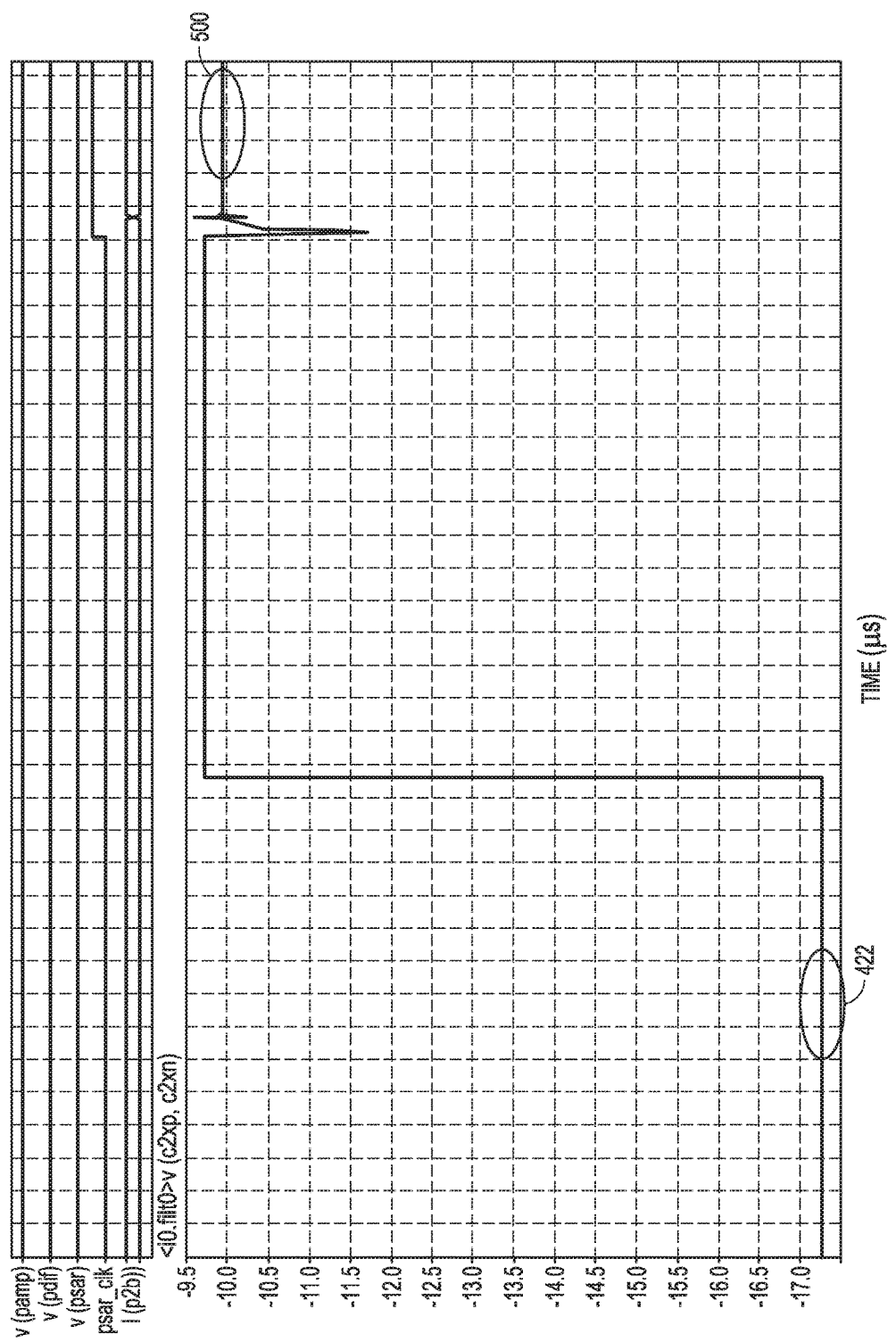
FIG. 5 continues the transient analysis results of the example of FIGS. 4A and 4B.

FIG. 5 continues the transient analysis results of the example of FIGS. 4A and 4B. At 500, the amplified residual the residual charge is shown being transferred from the series connected sampling capacitors C1$p$ and C1$n$ onto a storage capacitor C0 for use for feedback for noise-shaping during the next SAR cycle.

Figure 6:
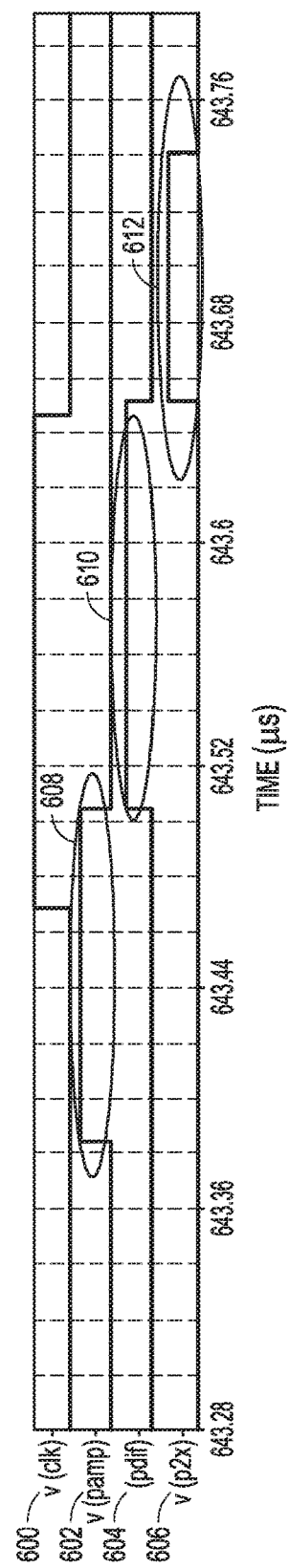
FIG. 6 shows another example of SPICE computer simulation transient analysis results, noting various occurrences on various signals of interest.

In the example shown in FIGS. 4A and 4B and FIG. 5, the residual transfer function, H, can be defined by Equation 1:

$$H = \frac{\frac{kC_1}{C_1 + C_0}}{1 - \frac{C_0}{C_0 + C_1}Z^{-1}}$$

where k is the amplifier gain, C1 is a small storage capacitor capacitance value for sampling the residue voltage, and C0 is a larger storage capacitor capacitance value for storing the sampled residue voltage. To approach a first order noise transfer function, C0=k*C1, for example FIG. 6 shows another example of SPICE computer simulation transient analysis results, noting various occurrences on various signals of interest. Signal 600 labeled "v(clk)" represents a clock signal in the timing circuit 205 of FIG. 2. Signal 602 labeled "v(pamp)" represents an output voltage of a first logic gate in the timing circuitry 205 of FIG. 2. Signal 606 labeled "v(pdif)" represents an output voltage of a second logic gate in the timing circuitry 205 of FIG. 2. Signal 606 labeled "v(p2x)" represents an output voltage of a third logic gate in the timing circuit 205 of FIG. 2.

The preamplifier portion 202 of the comparator circuit of FIG. 2 can use three phases to store the amplified residue voltage on a capacitor, the timing of which being graphically depicted in FIG. 6. First, during amplification phase, the capacitors can be pre-charged before the clock becomes active, as shown at 608. Then, the input signal can be amplified and the amplification can be stopped when the latch stage of the amplifier flips states, indicating that the required gain has been achieved. Second, during the voltage differential phase, the two capacitors C1$p$ and C1$n$ (FIG. 2) can be disconnected from the amplifier, and connected with opposite polarity to obtain a resulting voltage difference, as shown at 610. The differential voltage on the capacitor is half the amplified voltage, because of charge-sharing. Third, during a voltage doubling phase, a voltage doubling can optionally be used, such as by re-connecting the two capacitors in series, as shown at 612. The resulting voltage can be stored on a large storage capacitor for further use.

Figure 7A:
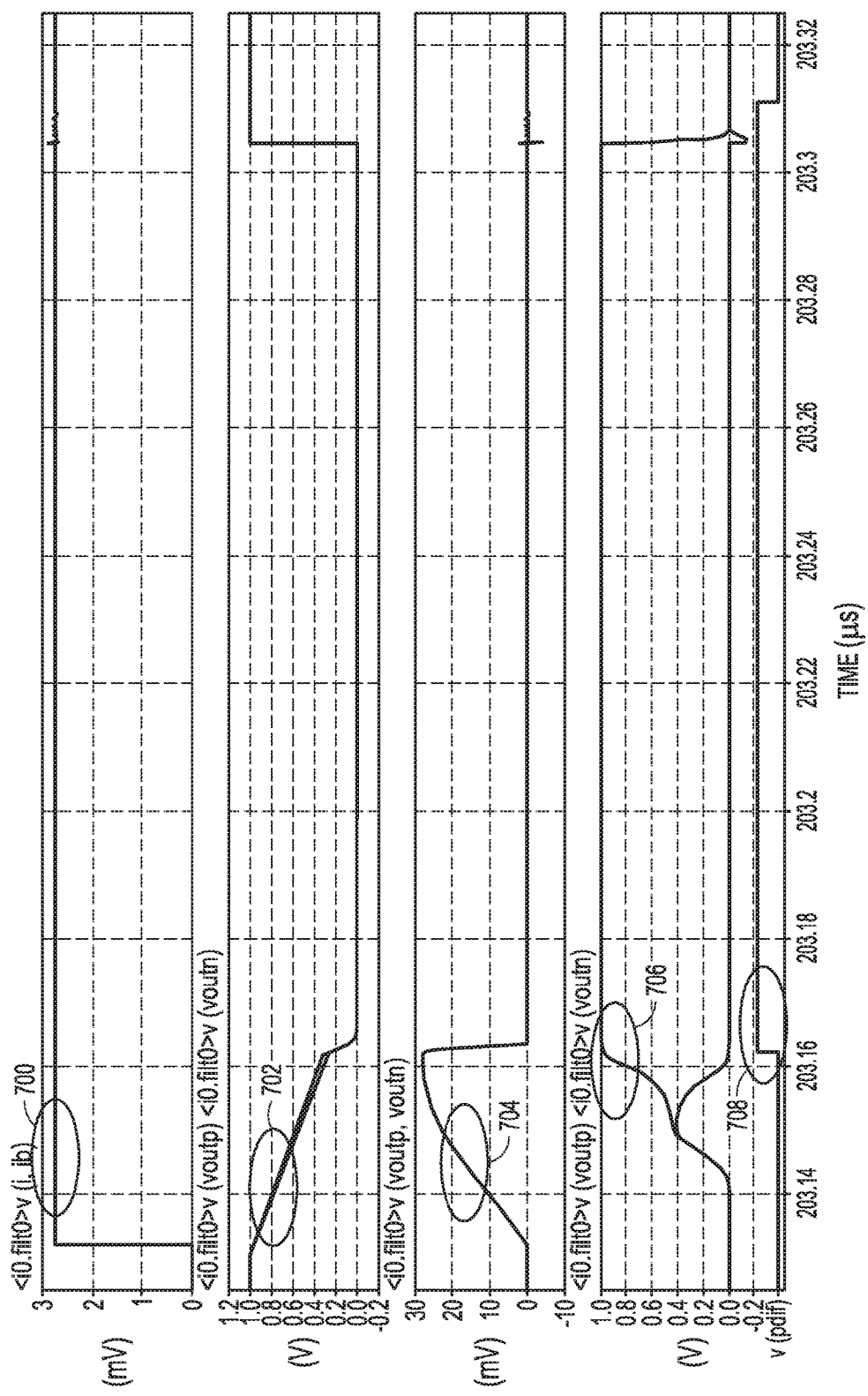
FIGS. 7A and 7B show another computer simulation transient analysis of the dynamic amplifier with further timing details, noting various occurrences on various signals of interest.
Figure 7B:
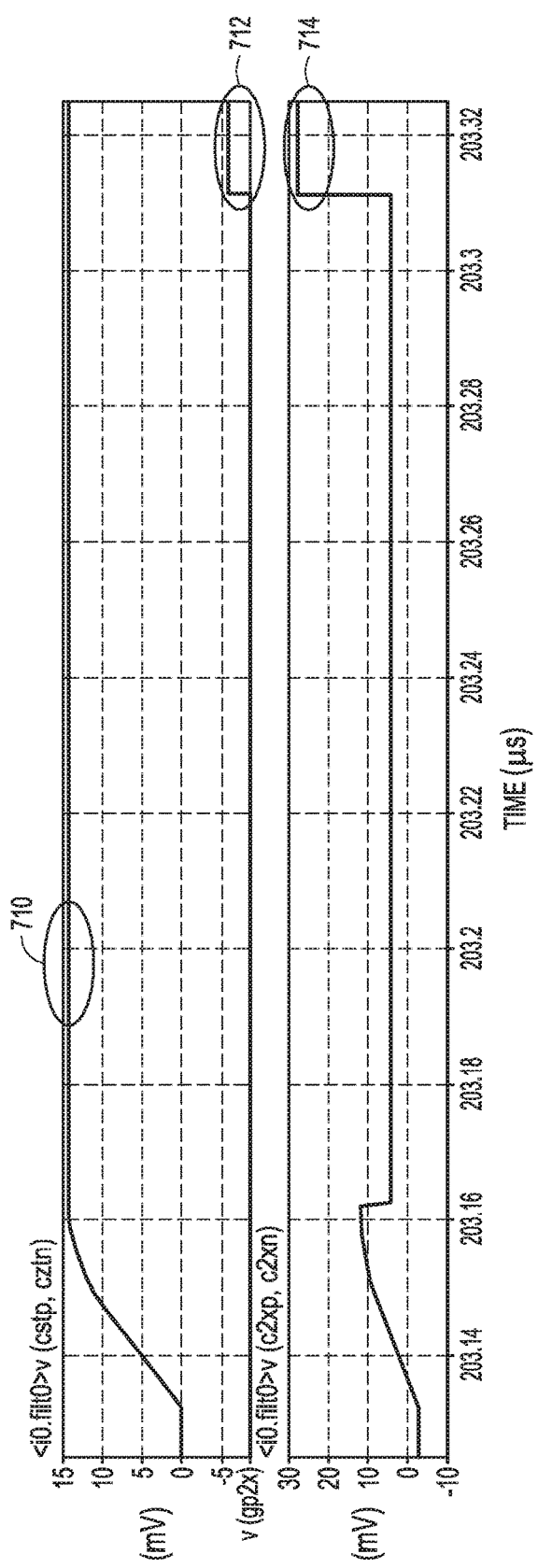

FIGS. 7A and 7B show another computer simulation transient analysis of the dynamic amplifier with further timing details, noting various occurrences on various signals of interest. The residual voltage at the input of the amplifier circuit is shown at 700. The amplification of the residual voltage is shown at 702. The voltage difference on the two capacitor loads C1$p$ and C1$n$ (FIG. 2) is shown at 704. Disconnecting the capacitors from the amplifier when the latch output flips state is shown at 706. A control signal to connect the capacitors oppositely to transfer the voltage difference onto a storage capacitor is shown at 708. The voltage on the capacitor being only half the amplified voltage difference due to charge sharing is shown at 710. A control signal to connect the capacitors in series to double the voltage difference is shown at 712. Finally, a capacitor final voltage being equivalent to the amplified residual voltage is shown at 714.

The various techniques described in this disclosure can be used various ADC architectures, including but not limited to, successive approximation register (SAR) ADC, pipelined ADC, sigma-delta ADC. In addition, the top plate or bottom plate sampling of the capacitive DAC can be used to implement various techniques of this disclosure.

Figure 8:
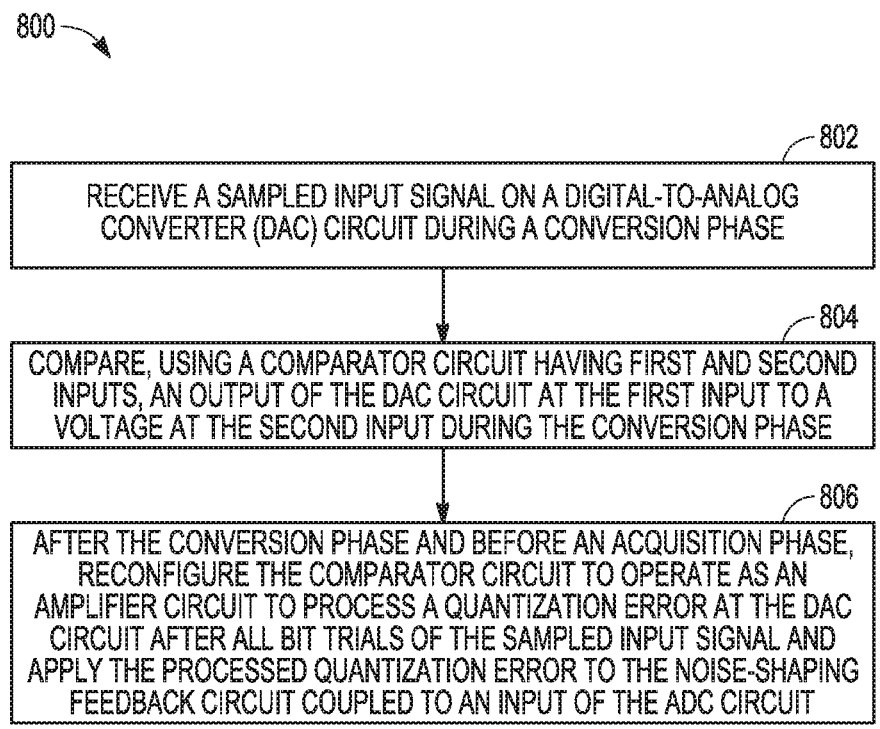
FIG. 8 is a flow chart depicting an example of a method of operating an analog-to-digital converter (ADC) circuit using various techniques of this disclosure.

FIG. 8 is a flow chart depicting an example of a method 800 of operating an ADC circuit using various techniques of this disclosure. At block 802, during a conversion phase, the method 800 includes receiving a sampled input signal on a digital-to-analog converter (DAC) circuit. For example, the ADC circuit 110 of FIG. 1 can receive a sampled input signal onto the DAC circuit 102 at input 108.

At block 804, the method 800 includes comparing, using a comparator circuit having first and second inputs, an output of the DAC circuit at the first input to a voltage at the second input. For example, the preamplifier portion 202 of FIG. 2 can compare an output of the DAC circuit 102 of FIG. 1 at first input 206 to a voltage at the second input 208 of the preamplifier portion 202, e.g., a reference voltage in a single-ended configuration or an output of a second DAC circuit in a differential configuration.

At block 806, after the conversion phase and before an acquisition phase, the method 800 includes reconfiguring the comparator circuit to operate as an amplifier circuit to process a quantization error at the DAC circuit after all bit trials of the sampled input signal and applying the processed quantization error to the noise-shaping feedback circuit coupled to an input of the ADC circuit.

Figure 9A:
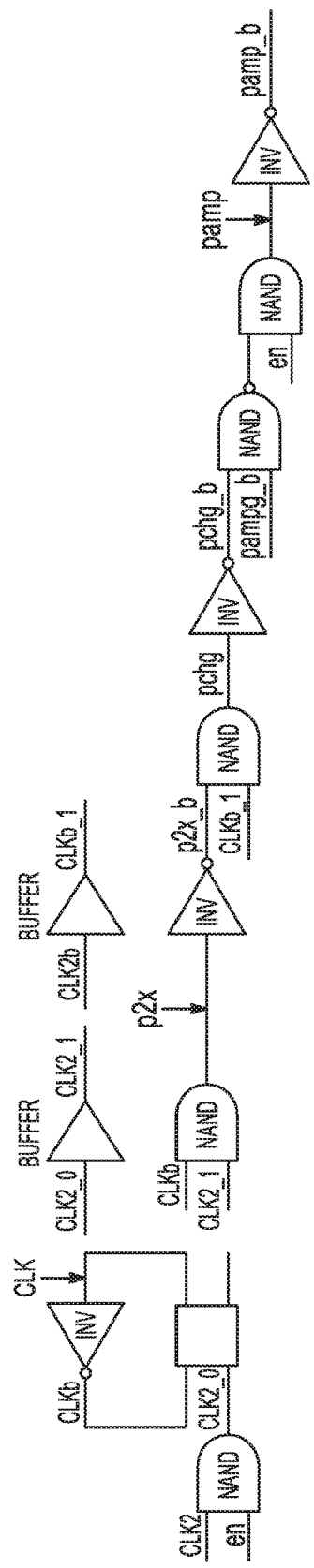
FIGS. 9A and 9B depict an example of logic circuitry that can be used for generating timing signals.
Figure 9B:
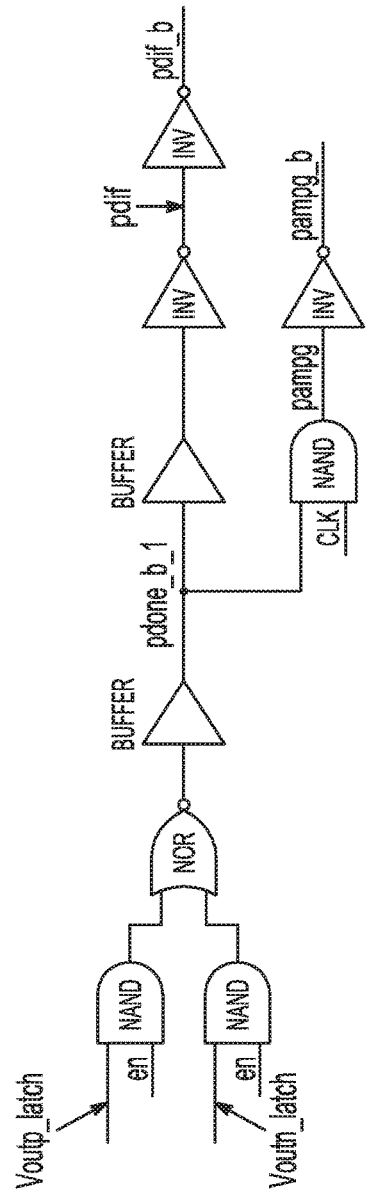

FIGS. 9A and 9B depict an example of logic circuitry that can be used for generating timing signals. In particular, FIGS. 9A and 9B show an example of logic circuitry that can be used for generating timing signals for re-using and operating the preamplifier portion 202 of the comparator circuit for sampling, buffering, or amplifying the residue, and storing for feedback use in applying noise-shaping during the next SAR cycle. Signals of particular interest include "Voutp_latch", "Voutn_latch", "clk", "pdif", and "pamp", which are shown in various transient analysis results in FIGS. 4A, 5, and 6, for example.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An analog-to-digital converter (ADC) circuit comprising:
    a digital-to-analog converter (DAC) circuit to receive a sampled input signal;
    a comparator circuit including a pre-amplifier circuit coupled to a latch circuit, the comparator circuit having first and second inputs, the first input coupled to an output of the DAC circuit and configured to compare the output of the DAC circuit at the first input to a voltage at the second input;
    a noise-shaping feedback circuit coupled to the first input of the comparator circuit; and
    a control circuit coupled to an output of the comparator circuit and an input of the DAC circuit, the control circuit configured to:
        after a conversion phase and before an acquisition phase, operate at least one of a plurality of switches to couple a primary capacitor to an output of the pre-amplifier circuit and an input of the latch circuit to reconfigure the comparator circuit in a closed loop configuration to operate as an amplifier to process a quantization error at the DAC circuit after all bit trials of the sampled input signal and apply the processed quantization error to the noise-shaping feedback circuit coupled to an input of the ADC circuit.

2. The ADC circuit of claim 1,
    wherein the control circuit is configured to:
    after a step of the conversion phase,
        operate at least one of the plurality of switches to transfer a charge stored on the primary capacitor that represents an amplified residual voltage to a secondary capacitor; and
    after the conversion phase and before a subsequent acquisition phase, operate at least one of the plurality of switches to apply a voltage representing a cumulative charge stored on the secondary capacitor to the input of the ADC, wherein the voltage representing the cumulative charge stored on the secondary capacitor includes a filtered version of the residual voltage.

3. The ADC circuit of claim 1, wherein the pre-amplifier circuit includes a dynamic amplifier circuit, and wherein the control circuit is configured to operate at least one of the plurality of switches to enable and disable the dynamic amplifier circuit in response to a state of the latch circuit.

4. The ADC circuit of claim 2, wherein the output of the pre-amplifier circuit includes a first output and a second output, wherein the input of the latch circuit includes a first input and a second input, wherein the pre-amplifier circuit includes a first input and a second input, wherein the primary capacitor includes a first primary capacitor and a second primary capacitor,
wherein the control circuit configured to operate at least one of the plurality of switches to couple the primary capacitor to an output of the pre-amplifier circuit and an input of the latch circuit is configured to:
operate at least one first switch of the plurality of switches to couple the first primary capacitor to the first output of the pre-amplifier circuit and the first input of the latch circuit; and
operate at least one second switch of the plurality of switches to couple the second primary capacitor to the second output of the pre-amplifier circuit and the second input of the latch circuit.

5. The ADC circuit of claim 4, wherein the control circuit is further configured to:
operate at least some of the plurality of switches to:
connect the first and second primary capacitors in opposition to generate a voltage difference;
connect the first and second primary capacitors in series to double the voltage difference,
wherein the control circuit configured to operate at least one of the plurality of switches to transfer the charge to a secondary capacitor is configured to:
operate at least one of the plurality of switches to transfer the charge from the first and second primary capacitors to the secondary capacitor.

6. The ADC circuit of claim 1, wherein the noise-shaping feedback circuit includes a passive filter circuit.

7. The ADC circuit of claim 1, wherein the comparator circuit is connected in a single-ended configuration.

8. The ADC circuit of claim 1, wherein the DAC circuit is a switched capacitor DAC circuit.

9. The ADC circuit of claim 1, wherein the ADC is a successive approximation register (SAR) ADC circuit.

10. A method of operating an analog-to-digital converter (ADC) circuit, the method comprising:
during a conversion phase:
receiving a sampled input signal on a digital-to-analog converter (DAC) circuit;
using a comparator circuit including a pre-amplifier circuit coupled to a latch circuit, the comparator circuit having first and second inputs, comparing an output of the DAC circuit at the first input to a voltage at the second input; and
after the conversion phase and before an acquisition phase:
coupling a primary capacitor to an output of the pre-amplifier circuit and an input of the latch circuit to reconfigure the comparator circuit in a closed loop configuration to operate as an amplifier to process a quantization error at the DAC circuit after all bit trials of the sampled input signal and applying the processed quantization error to the noise-shaping feedback circuit coupled to an input of the ADC circuit.

11. The method of claim 10, further comprising:
transferring a charge stored on the primary capacitor that represents an amplified residual voltage to a secondary capacitor; and
after the conversion phase and before the acquisition phase, applying a voltage representing a cumulative charge stored on the secondary capacitor to the noise-shaping feedback circuit, wherein the voltage representing the cumulative charge stored on the secondary capacitor includes the residual voltage.

12. The method of claim 11, wherein the pre-amplifier circuit includes a dynamic amplifier circuit, the method comprising:
enabling and disabling the dynamic amplifier circuit in response to a state of the latch circuit.

13. The method of claim 11, wherein the output of the pre-amplifier circuit includes a first output and a second output, wherein the input of the latch circuit includes a first input and a second input, wherein the pre-amplifier circuit includes a first input and a second input, wherein the primary capacitor includes a first primary capacitor and a second primary capacitor, wherein amplifying a residual voltage at an input of the amplifier circuit and controlling a storage of a charge representing the residual voltage on the primary capacitor includes:
amplifying a first residual voltage at the first input of the pre-amplifier circuit and controlling a storage of a charge representing the first residual voltage on the first primary capacitor; and
amplifying a second residual voltage at the second input of the pre-amplifier circuit and controlling a storage of a charge representing the second residual voltage on the second primary capacitor.

14. The method of claim 13, further comprising:
disconnecting the first and second primary capacitors from the pre-amplifier circuit;
connecting the first and second primary capacitors in opposition to generate a voltage difference;
connecting the first and second primary capacitors in series to double the voltage difference, and
wherein transferring the charge stored on the primary capacitor that represents an amplified residual voltage to a secondary capacitor includes:
transferring the charge from the first and second primary capacitors to the secondary capacitor.

15. The method of claim 10, further comprising:
filtering the processed quantization error applied to the noise-shaping feedback circuit using a passive filter circuit.

16. The method of claim 10, further comprising:
connecting the comparator circuit in a single-ended configuration.

17. The method of claim 10, including:
operating the ADC circuit as a successive approximation register (SAR) ADC circuit.

18. An analog-to-digital converter (ADC) circuit comprising:
a digital-to-analog converter (DAC) circuit to receive a sampled input signal;
a comparator circuit including a pre-amplifier circuit coupled to a latch circuit, the comparator circuit having first and second inputs, the first input coupled to an output of the DAC circuit and configured to compare the output of the DAC circuit at the first input to a voltage at the second input;

a noise-shaping feedback circuit coupled to the first input of the comparator circuit; and means for reconfiguring the comparator circuit in a closed loop configuration to operate, after the conversion phase and before an acquisition phase, as an amplifier to process a quantization error at the DAC circuit after all bit trials of the sampled input signal and apply the processed quantization error to the noise-shaping feedback circuit coupled to an input of the ADC circuit.

19. The ADC circuit of claim 18, further comprising:

means for storing a charge representing a residual voltage;

means for transferring the charge to a capacitor; and means for applying a voltage representing a cumulative charge stored on the capacitor to the noise-shaping feedback circuit after the conversion phase and before the acquisition phase, wherein the voltage representing a cumulative charge stored on the capacitor includes the residual voltage.

20. The ADC circuit of claim 18, wherein the ore-amplifier circuit includes a dynamic amplifier circuit, the ADC circuit further comprising:

means for enabling and disabling the dynamic amplifier circuit in response to a state of the latch circuit.

* * * * *

UNITED STATES PATENT AND TRADEMARK OFFICE
CERTIFICATE OF CORRECTION

PATENT NO. : 10,284,213 B2
APPLICATION NO. : 15/912128
DATED : May 7, 2019
INVENTOR(S) : Bandyopadhyay et al.

Page 1 of 1

It is certified that error appears in the above-identified patent and that said Letters Patent is hereby corrected as shown below:

In the Claims

In Column 13, Lines 21-22, in Claim 20, delete "ore-amplifier" and insert --pre-amplifier-- therefor Signed and Sealed this
Seventeenth Day of September, 2019

Andrei Iancu
*Director of the United States Patent and Trademark Office*